United States Patent [19]
Jeffrey et al.

[11] Patent Number: 6,151,257
[45] Date of Patent: Nov. 21, 2000

[54] APPARATUS FOR RECEIVING/ TRANSMITTING SIGNALS IN AN INPUT/ OUTPUT PAD BUFFER CELL

[75] Inventors: Smith E. Jeffrey, Aloha; Timothy W. Kelly, Beaverton; Stephen W. Kiss, Banks; Keith M. Self, Aloha, all of Oreg.

[73] Assignee: Intel Corporation, Santa Clara, Calif.

[21] Appl. No.: 09/013,482

[22] Filed: Jan. 26, 1998

[51] Int. Cl.[7] ..................................................... G11C 7/00
[52] U.S. Cl. ........................... 365/189.05; 365/52; 365/63
[58] Field of Search .................................. 395/800, 750; 341/143; 365/189.05, 189.08, 52, 63

[56] References Cited

U.S. PATENT DOCUMENTS

| | | | |
|---|---|---|---|
| 5,276,893 | 1/1994 | Savaria ..................................... | 395/800 |
| 5,300,835 | 4/1994 | Assar et al. .............................. | 307/475 |
| 5,515,540 | 5/1996 | Grider et al. ............................ | 395/750 |
| 5,594,442 | 1/1997 | Paulos et al. ............................ | 341/143 |
| 5,812,490 | 9/1998 | Tsukude ................................... | 365/233 |
| 5,900,021 | 5/1999 | Tiede et al. ............................. | 711/170 |

*Primary Examiner*—David Nelms
*Assistant Examiner*—Thong Le
*Attorney, Agent, or Firm*—Kenyon & Kenyon

[57] ABSTRACT

An electronic circuit die is presented including a plurality of first and second input/output (I/O) pad buffer cells. The first I/O pad buffer cells include at least a latch for latching data signals received at a pad in the cell. Adjacent ones of these first I/O pad buffer cells are conductively coupled together using conductive trace pins. The second I/O pad buffer cells include a pad that receives clocking signal which are supplied to the latches of the first I/O pad buffer cells. Accordingly, data signals received at the pads of the die are latched in the pad as opposed to the core logic of the die. One benefit of providing the latching of data signals in the pad is that conductive traces between the latches and the core logic need not be precisely matched, thus reducing cost. Also, the first I/O pad buffer cells can be similarly constructed, thus reducing the complexity and cost of manufacture for the die.

16 Claims, 15 Drawing Sheets

APPARATUS FOR RECEIVING/ TRANSMITTING SIGNALS IN AN INPUT/ OUTPUT PAD BUFFER CELL

BACKGROUND OF THE INVENTION

The present invention pertains to an apparatus for the input and output of signals to and from an electronic circuit. More particularly, the present invention pertains to providing electronic circuitry for the latching of data in the input/output pad buffer cells of an integrated circuit or the like.

Electronic circuits, such as integrated circuits, typically include a die in which a number of circuit elements are placed. The die is then incorporated into a package with pins or lands for coupling to other devices and integrated circuits (e.g., via a printed circuit board). Referring to FIG. 1, a typical integrated circuit (IC) package is shown. A die 1 is coupled to the upper surface of a support structure 5. Electronic circuits on die 1 are coupled with a bond wire 2, through support structure 5, to a connector 6, such as a pin for insertion into a board or a land for electrical coupling to the board using a land grid array or ball grid array as is known in the art.

Referring to FIG. 2, a plan view of die 1 (FIG. 1) is shown. In this example, die 1 includes a core logic area 11 and a number of input/output (I/O) pad buffer cells (e.g., I/O pad buffer cell 12). An I/O pad buffer cell includes a pad for electrical coupling to a bond wire (e.g., bond wire 2 in FIG. 1) and may include circuitry for buffering the incoming and outgoing signals. For example, a data signal received from bond wire 2 passes through a pad in I/O pad buffer cell 12 and then through a buffering circuit. The resulting signal is then passed through a conductive trace (e.g., trace 14a) to receive latches 13 in core logic area 11. Also, data to be output through I/O pad buffer cell 12, is transferred from core logic area 11 through another conductive trace (e.g., trace 14b) to a separate buffering circuit on cell 12 and on to the pad and bond wire.

One characteristic that may be seen with integrated circuits of this type is that the traces coupling each pad buffer cell 12 to core logic area 11 may not be precisely matched (e.g., have the same length). Thus, if several bits of data are received in parallel in several of the I/O pad buffers, each bit will arrive at different times at receive latches 13. This is commonly referred to as skew. Furthermore, as is known in the art, data signals are typically latched in relation to a received clocking signal which also may be skewed from the received data signals. One method for correcting this problem is to make the traces (e.g., traces 14a–b) between the I/O pad buffer cells 12 and the receive latches 13 matched. This can be problematic, however, in the design of the electronic circuit on die 1 because other electronic circuits typically appear on the die between the core logic area 11 and the I/O pad buffer cells 12.

In view of the aforementioned problems there is a need for a method and apparatus that provides for the latching of data signals or the like that overcomes these problems.

SUMMARY OF THE INVENTION

According to an embodiment of the present invention, an electronic circuit die is provided including a plurality of first input/output pad buffer cells, each having a pad adapted to be coupled to a bond wire and a latch coupled to the pad and adapted to receive data signals from the pad.

DETAILED DESCRIPTION

Figure 3:
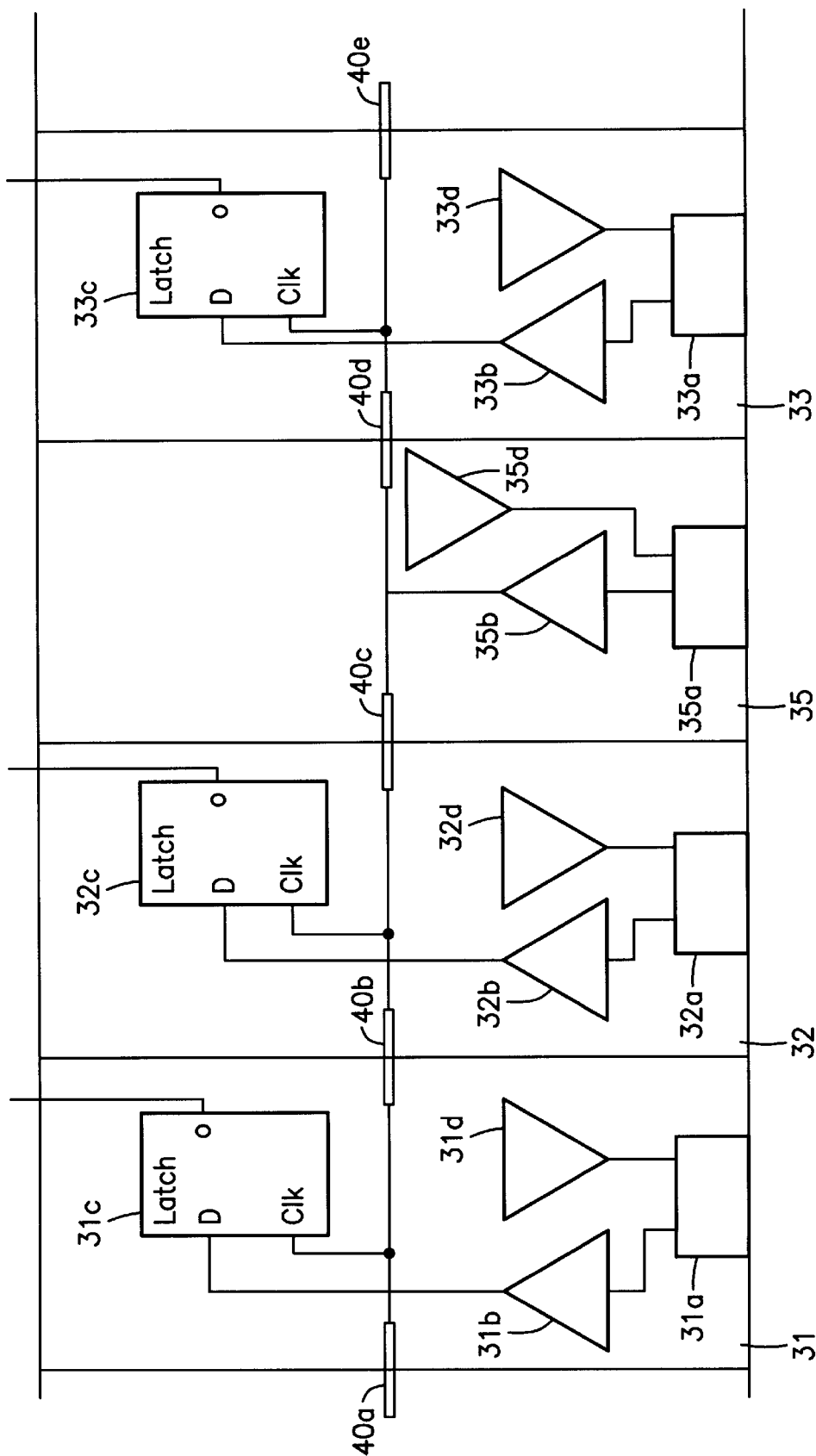
FIG. 3 is a block diagram of an embodiment of the present invention.

Referring to FIG. 3, an example of the present invention is shown. A plurality of I/O pad buffer cells 31–33 and 35 are provided in a die. According to an embodiment of the present invention, first I/O pad buffer cells 31–33 are of similar construction and adapted to receive and latch data signals received at pads 31a, 32a, and 33a. A second I/O buffer cell 35 is adapted to receive a clocking signal at pad 35a. Looking at cell 31 as an example, data signals received at pad 31a are passed to buffer circuit 31b and then to an input of a latch 31c. In this example, latch 31c is a data-inverting latch having a D input, a clock input ("clk") and an output ("o"). The clocking signal received at pad 35a can be passed through a buffer circuit 35b and then to latches 31c, 32c, 33c. In this embodiment, conductive trace pins 40a–e are provided to conductively connect circuitry in each cell 31–33 and 35.

Figure 1:
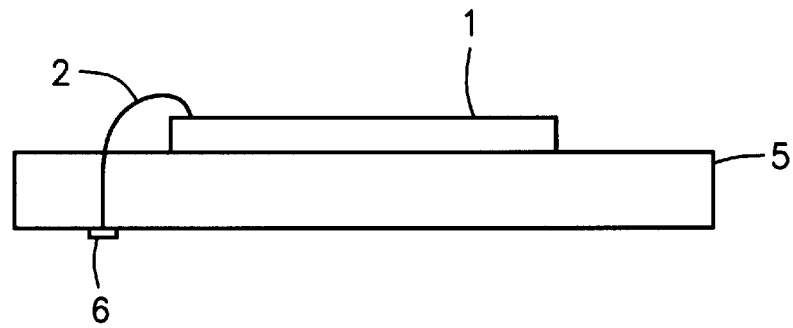
FIG. 1 is a side view of an integrated circuit chip as is known in the art.
Figure 2:
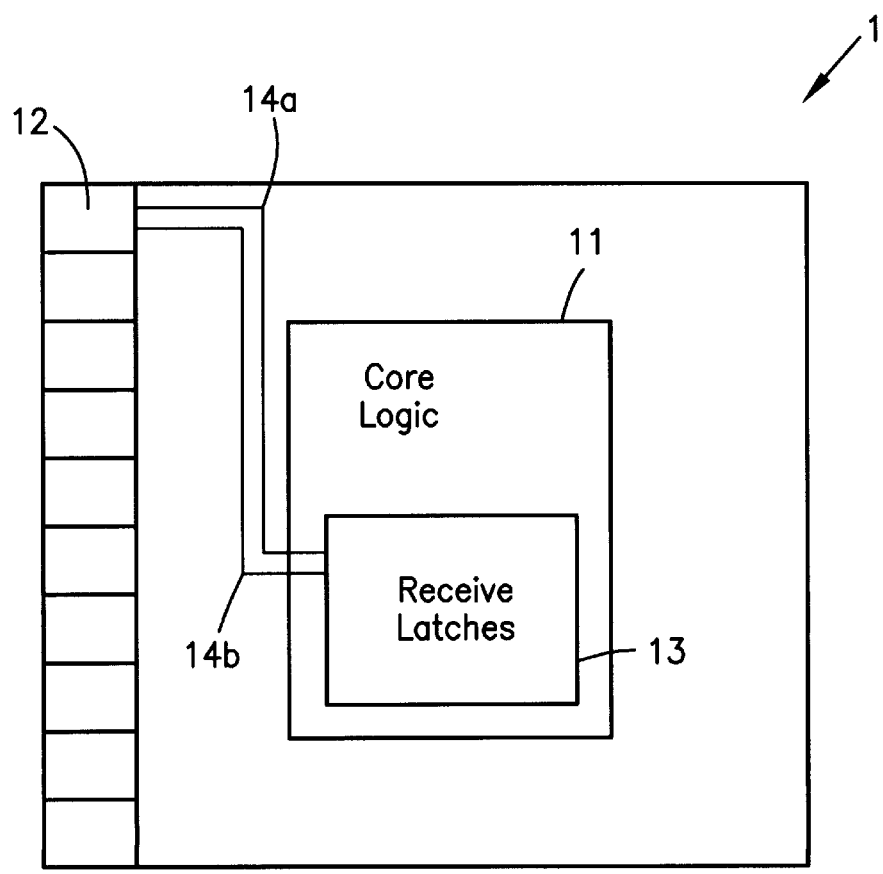
FIG. 2 is a plan view of the die of FIG. 1.

The apparatus of FIG. 3 reduces costs in chip design. In this embodiment, the data latch circuits of cells 31–33 are of similar design. Therefore, during the manufacture of the die, the same circuit components and traces are repeated in many cells, thus reducing the complexity of the die circuitry. With the present invention, traces from latches 31c, 32c, and 33c to any core logic do not need to be closely matched, while in the example of FIGS. 1 and 2, the traces from each cell to receive latches in the core logic must be closely matched, increasing complexity and cost of manufacturing for the die.

Though the apparatus of FIG. 3 has been described with respect to the receipt of data signals from pads 31a, 31b, 31c, the present invention may be extended to the sending of data signals through these pads to data signal lines. In the apparatus of FIG. 3, buffer circuits 31d, 32d, 33d are provided for transmitting data signals from respective latches (not shown) to pads 31a, 32a, and 33a. Likewise, a buffer circuit 35d can be provided to transfer clocking signals to pad 35a and onto clocking signal lines. A more detailed example of the circuitry that may be included in the first and second I/O pad buffer cells is described below.

Figure 4:
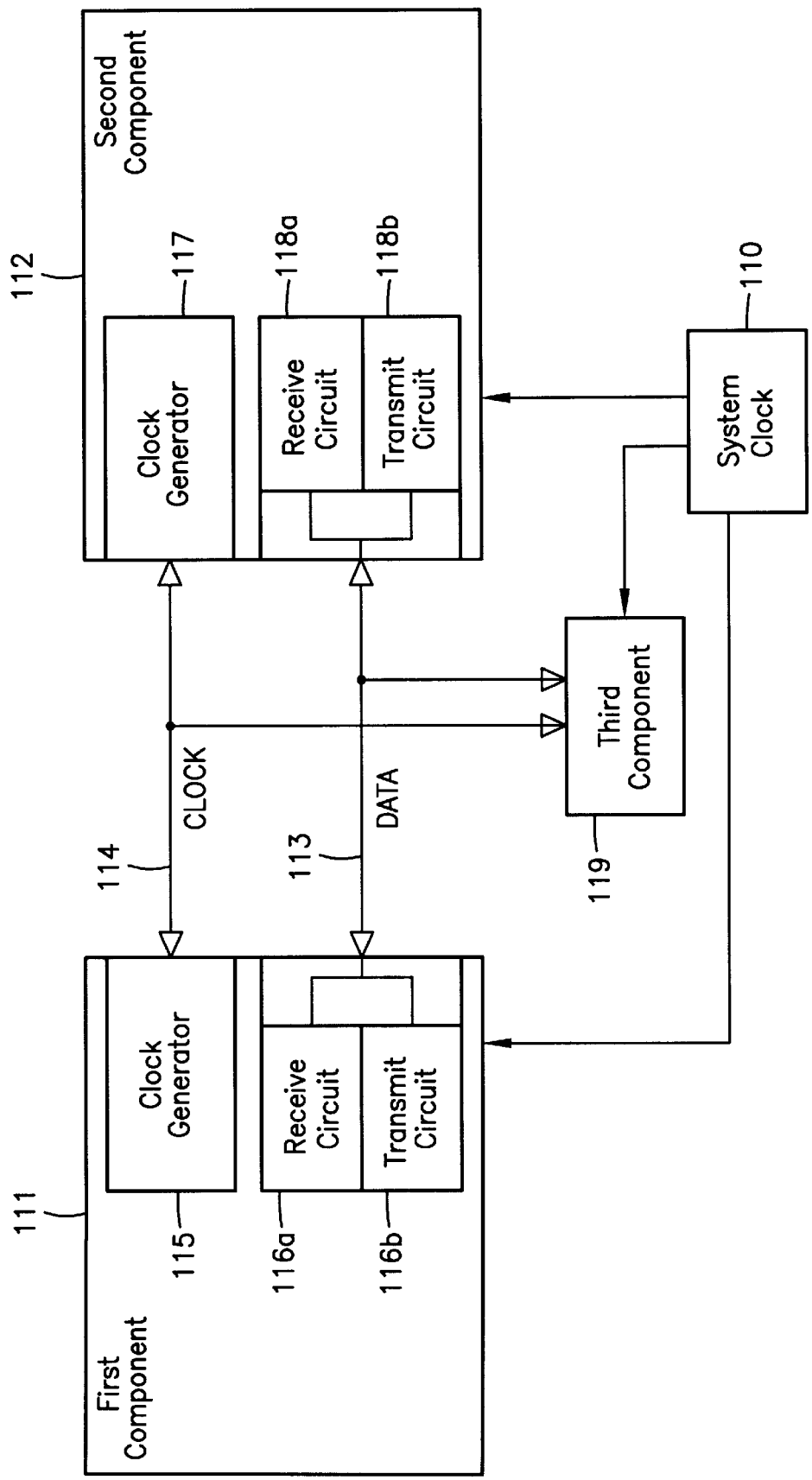
FIG. 4 is a block diagram of an apparatus for transmitting data and clocking signals between components that employs an embodiment of the present invention.

Referring to FIGS. 4–10, examples of systems that can employ the apparatus of FIG. 3 are shown. In FIG. 4, a first component 111 is coupled to a second component 112 via one or more data signal lines 113 and one or more clocking signal lines 114. A system clock 110 provides a clocking signal to first and second components 111, 112. When first component 111 seeks to transmit data to second component 112, it drives the appropriate data signals onto line 113 along with a clocking signal onto clocking signal line 114. Second component 112 receives and latches (e.g., via receive circuit 118a) the data from the data signal line(s) 113 in relation to the clocking signal appearing on clocking signal line 114. For example, the first component 111 can drive data signals onto data signal lines 113 via a transmit circuit 116b and send out a clocking signal via clock generator 115, and the second component can receive and latch this data during high-to-low transition of the same clocking signal. The manner for transmitting data signals from one component to another can be referred to as "source synchronous" because the latching of data signals at the receiving component is synchronized to a clocking signal from the transmitting (or source) component. One skilled in the art will appreciate that other types of signals other than data signals can be sent from and latched in first component 111 and second component 112 such as control signals, address signals, etc. Accordingly, as used herein the terms "data" and "data signals" include control, address, and other such signals.

Figure 5:
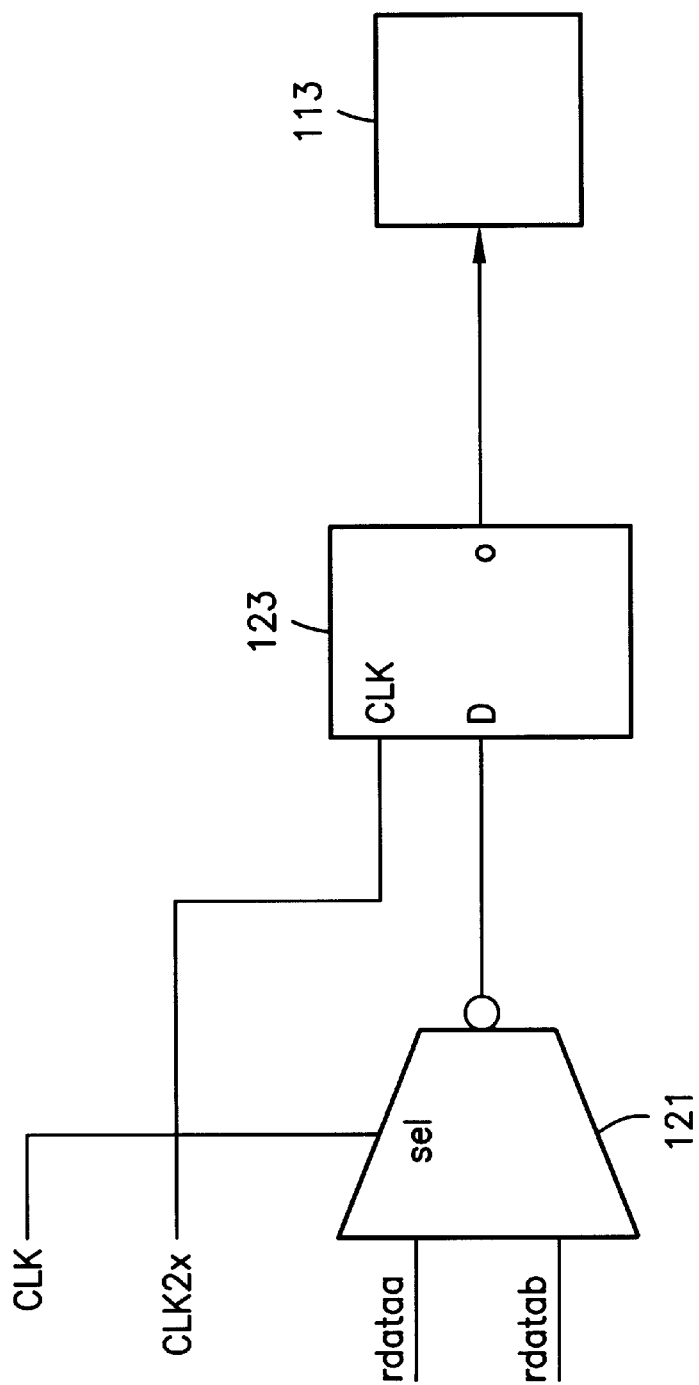
FIG. 5 is a circuit diagram showing an example of a transmit circuit for the apparatus of FIG. 4.

Referring to FIG. 5, a circuit diagram of a transmit circuit for elements 116b and 118b in FIG. 4 is shown. According to an embodiment of the present invention, the transmit circuit of FIG. 5 can be placed in an I/O pad buffer cell (e.g., cell 31 in FIG. 3). In this example, data to be driven onto the data signal lines is provided at inputs "rdataa" and "rdatab" and are supplied to inputs of a multiplexer 121. The "select" input to multiplexer 121 is supplied by a first clock signal "clk." Accordingly, as the clk signal transitions between high (i.e., logical "1") and low (i.e., logical "0") values, the data appearing at the inputs rdataa and rdatab are supplied to the output of multiplexer 121. The output of multiplexer 121 is supplied to the D input of a flip-flop 123. In this embodiment, flip-flop 123 is a rising-edge-triggered master-slave flip-flop. The clock input of flip-flop 123 is coupled to a source that is supplying a signal "clk2x" which, in this example, has a frequency twice that of the clk signal described above. The output of flip-flop 123 is then data from dataa and datab and is supplied to data signal lines 113 at a rate twice that of the frequency of the clk signal.

Figure 6A:
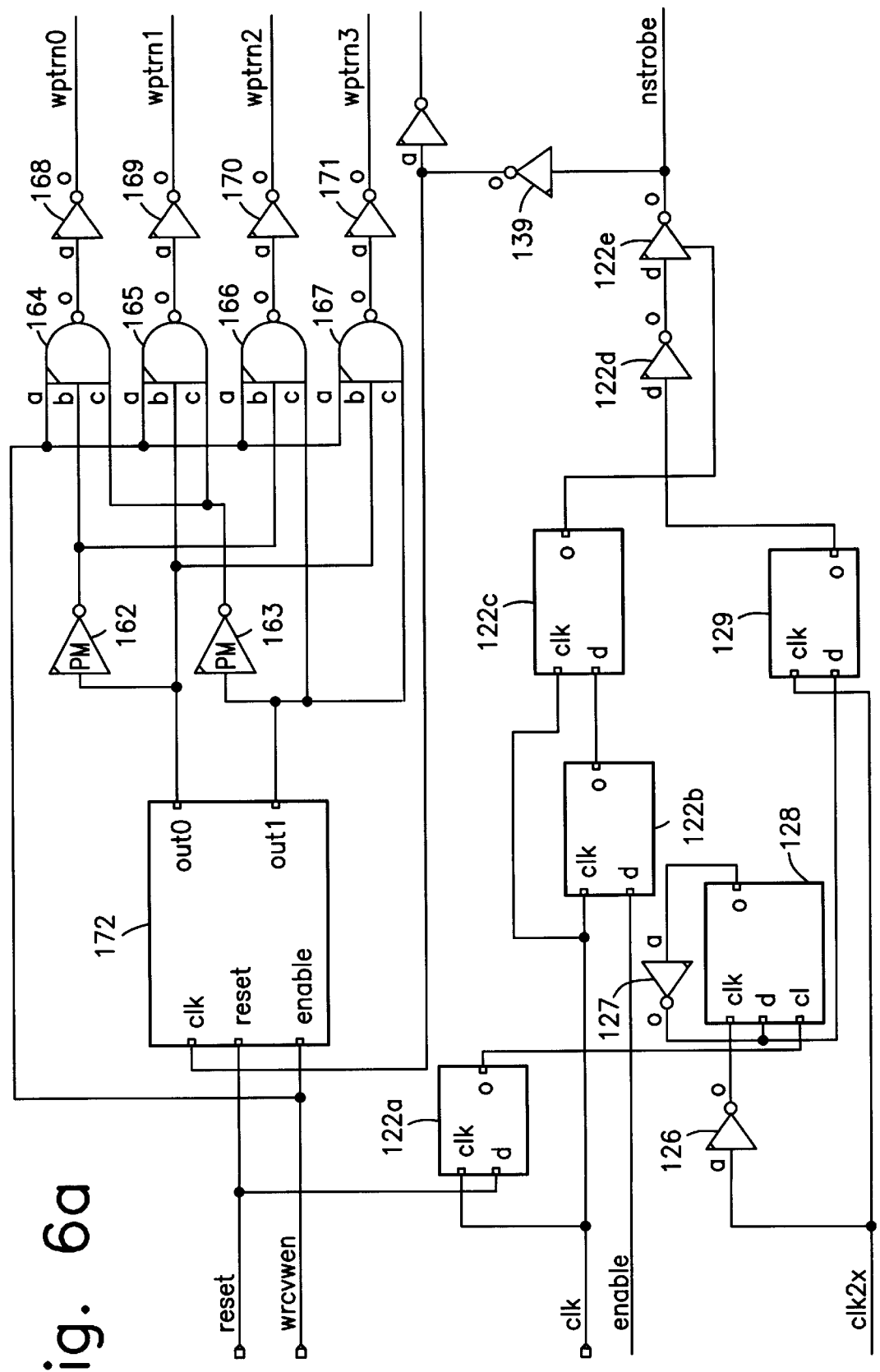
FIGS. 6a–b are circuit diagrams showing examples of clock generators of the apparatus of FIG. 4.
Figure 6B:
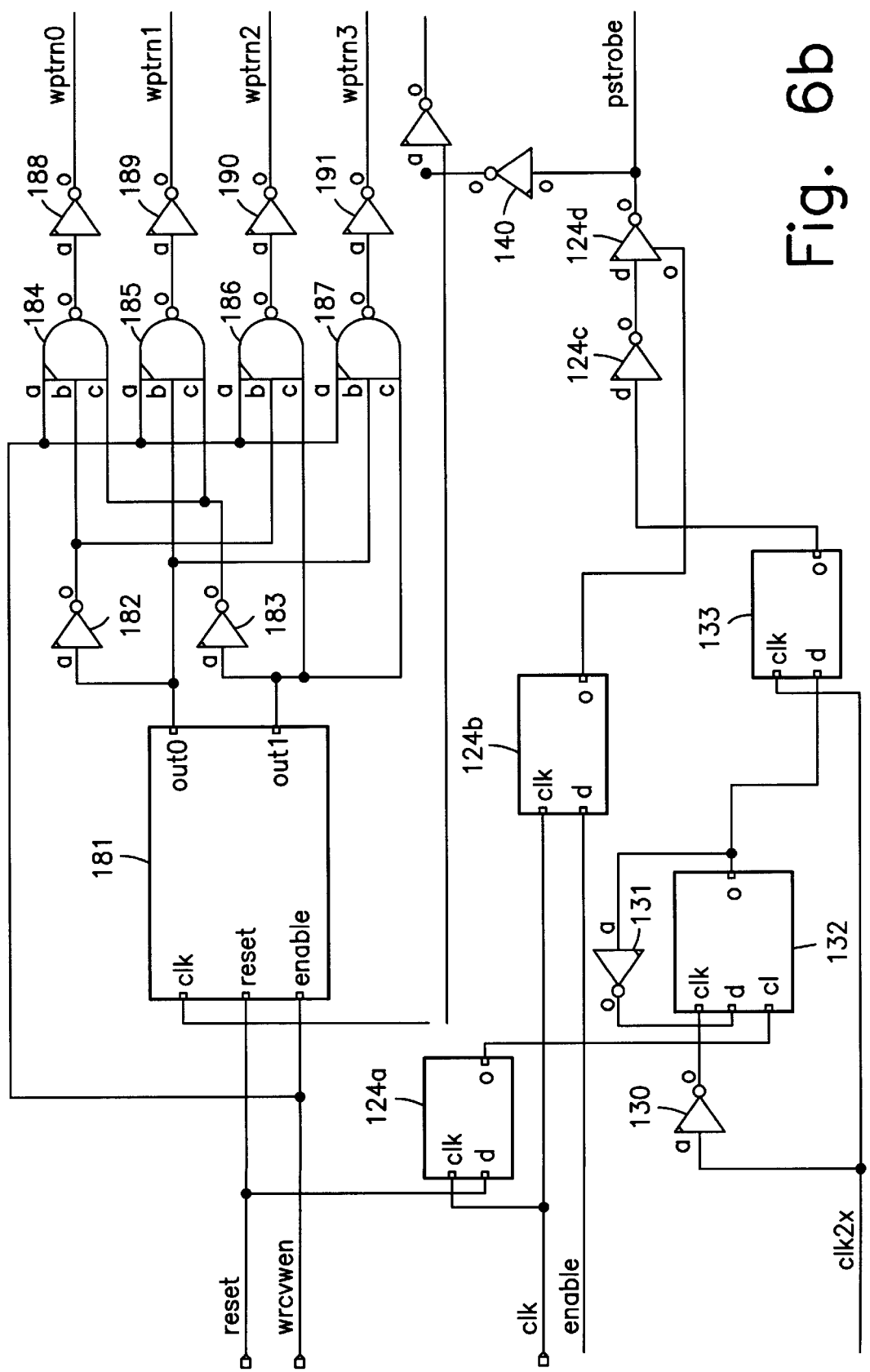

Referring to FIGS. 6a–b, an example of a clock generator, such as for elements 115 and 117 in FIG. 4 is shown. According to an embodiment of the present invention, the clock generator circuits of FIGS. 6a–b may be placed in an I/O pad buffer cell (e.g., cell 35 in FIG. 3). Referring to FIG. 6a, a clock signal (such as clk2x) is provided as the clock (ck) input of a rising-edge-triggered master-slave flip-flop 128 via an inverter 126. In this embodiment, the frequency of the clk2x signal is 200 MHZ. The output (o) of flip-flop 128 is supplied to the D input of flip-flop 128 via inverter 127 and the D input of a falling-edge-triggered master-slave flip-flop 129. The clk2x signal is also supplied to the clock (ckb) input of flip-flop 129. The output of flip-flop 129 is a clock signal with a frequency of 100 MHz and can be supplied through inverter 122d and tri-state buffer 122e to drive the clocking signal, "nstrobe." For reset purposes, a reset signal can be supplied to the D input of a flip-flop 122a, and the clk signal can be supplied to the ck input of flip-flop 122a. When a reset signal is asserted, flip-flop 122a synchronizes that signal with the clk signal and supplies it to the "cl" (clear) input of flip-flop 128 to reset that device. Also shown in FIG. 6a, a flip-flop 122b may be provided to receive an "enable" signal at its D input and the clk signal at its "ck" input. The output of flip-flop 122b is supplied to the D input of latch 122c which also receives the clk signal at its "ckb" input. The output of latch 122c is supplied to tri-state buffer 122e which controls the driving of the nstrobe signal onto a clocking signal line. In effect, latch 122c delays the driving of the nstrobe signal as described below with respect to FIG. 8.

In a further embodiment, a second clocking signal is generated and sent with the data signal(s) and can be generated with the circuit of FIG. 6b. As in the example of FIG. 6a, the clk2x signal is provided to the ck input of a rising-edge-triggered master-slave flip-flop 132 via an inverter 130. Also, the output of flip-flop 132 is supplied to the D input of flip-flop 132 via inverter 131. The non-inverted output of flip-flop 132 is supplied to the D input of a falling-edge-triggered master-slave flip-flop 133. The output of flip-flop 133 is also a clock signal with a frequency of 100 MHz, but is out of phase with the output of flip-flop 129 (FIG. 6a) by 180°. This output of flip-flop 133 can be supplied through inverter 124c and tri-state buffer 124d to drive the clocking signal, "pstrobe." For reset purposes, a reset signal can be supplied to the D input of a flip-flop 124a, and the clk signal can be supplied to the ck input of flip-flop 124a. When a reset signal is asserted, flip-flop 122a synchronizes that signal with the clk signal and supplies it to the "cl" (clear) input of flip-flop 132 to reset that device. Also shown in FIG. 6b, a flip-flop 124b may be provided to receive an "enable" signal at its D input and the clk signal at its "ck" input. The output of flip-flop 124b is supplied to tri-state buffer 124d which controls the driving of the pstrobe signal onto a clocking signal line.

Figure 7:
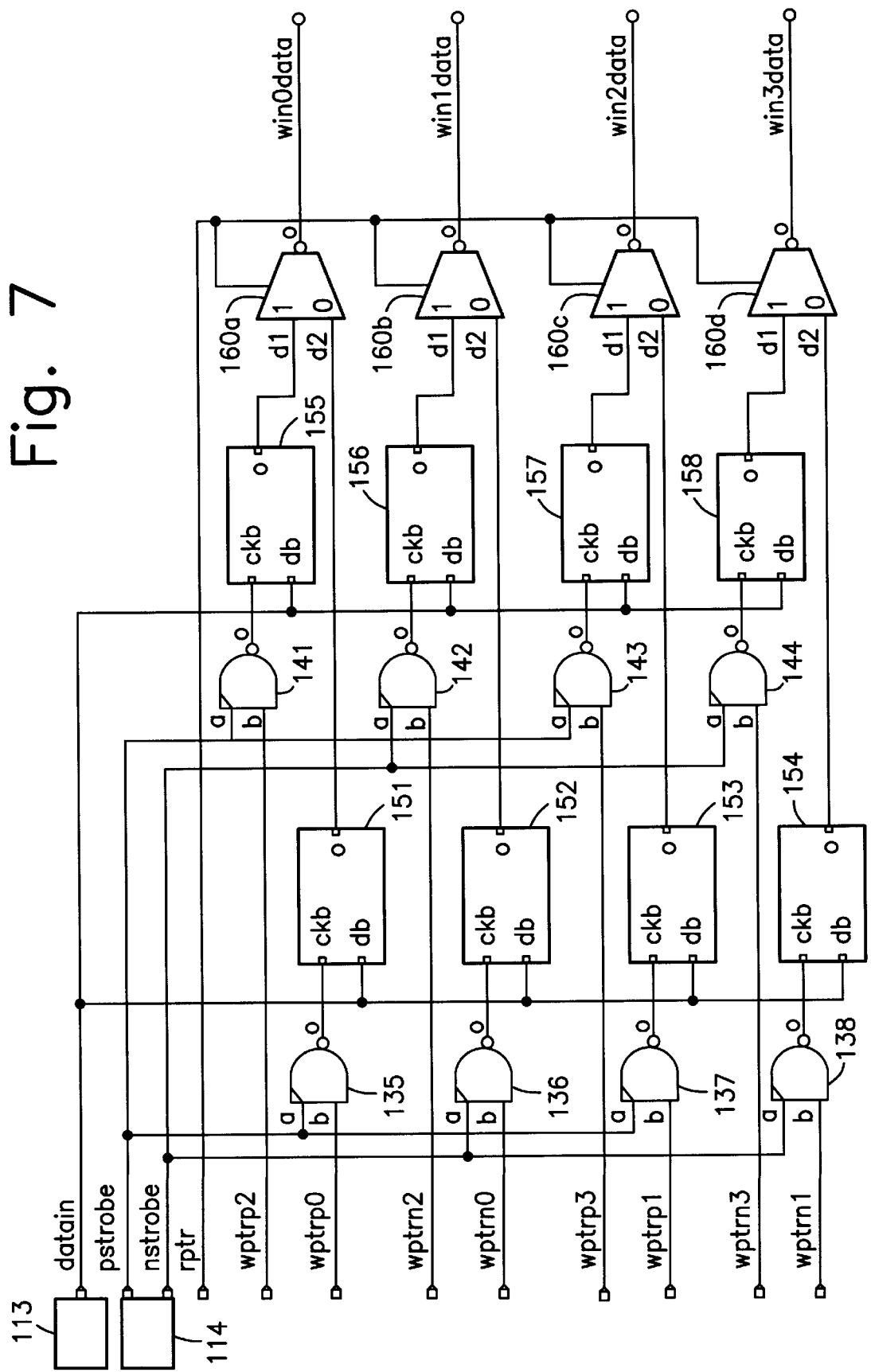
FIG. 7 is a circuit diagram showing an example of a receive circuit for the apparatus of FIG. 4.

An example of a receive circuit (e.g., elements 116a and 116b in FIG. 4) for eight bits of data is shown in FIG. 7. In this example, a serial stream of data bits is supplied from data signal lines 113 (see FIG. 1) as the input "datain," which is supplied to the "db" input of a plurality of data-inverting latches 151–158. The pstrobe signal from one of the clocking signal lines 114 is supplied to an input of NAND gates 135, 137, 141, and 143. The nstrobe signal from another of the clocking signal lines is supplied to an input of NAND gates 136, 138, 142, and 144. The other inputs of NAND gates 135–38 and 141–44 are coupled to a number of write pointer signals as further described below.

Referring back to FIG. 6a, the clock generator at the component receiving the data signals can be modified to generate four of the write pointer signals used in the circuit of FIG. 7. In this example, a two-bit counter 172 generates a two bit value that changes upon the receipt of the nstrobe signal via inverter 139 from a clocking signal line. The first output (out0) of counter 172 is provided to inputs of NAND gates 165 and 167, as well as to inputs of NAND gates 164 and 166 via inverter 162. The second output (out1) is provided to an input of NAND gates 166 and 167, as well as to an input of NAND gates 164 and 165 via inverter 163. The remaining inputs of NAND gates 164–67 can be supplied by a write receiver enable ("wrcven") signal, where a low value for this signal insures that the outputs of NAND gates 164–67 are always at 1 (i.e., a high value). The outputs of NAND gates 164–67 are provided to inverters 168–71 which generate write pointer signals, wptrn0, wptrn1, wptrn2, and wptrn3. In summary, elements 62–71 function as a 2-to-4 decoder. When the output of counter 172 has a value 00, only the wptrn0 signal is asserted, when the out1 signal has a 1 value and the out0 signal has a 0 value, the wptrn0 signal transitions to a low value and the wptrn1 signal transitions to a high value. Accordingly, in response to each nstrobe signal a different write pointer signal is asserted.

Referring to FIG. 6b, the clock generator circuit can be further modified to generate another set of write pointer signals. The pstrobe signal is supplied to the clk input of a two-bit counter 181 via inverter 140 from a clocking signal line. The outputs of counter 181 are provided, non-inverted and inverted by inverters 182–83, to NAND gates 184–87 in manner similar to what is shown in FIG. 6*a*. Also, the outputs of NAND gates 184–87 are provided to inverters 188–91 to generate write pointer signals, "wptrp0," "wptrp1," "wptrp2," and "wptrp3," respectively.

Referring to FIG. 7, write pointer wptrp0 is generated and supplied with the pstrobe signal as inputs to NAND gate 135, the output of which is coupled to the "ckb" input of latch 151. Latch 151 is transparent when the ckb input is at 0. Accordingly, when both the pstrobe and wptrp0 signals are asserted, the data from datain passes through the db input to the output of latch 151. At some later point in time, the pstrobe signal transitions to a low value, and this output is latched. A small delay later, the wptrp0 signal transitions to a low value as well.

The nstrobe signal transitions to a high value and the write pointer signal wptrn0 signal is generated. The wptrn0 and nstrobe signals are supplied as inputs to NAND gate 136 which generates a low signal when both inputs are at a high value. As with latch 151, the output from datain passes through input db of latch 152 to the output and is latched when the nstrobe signal transitions from a high value to a low value (i.e., the ckb input goes to a high value). Then, the pstrobe signal transitions to a high value as well as the wptrp1 signal and these two signals are provided as inputs to NAND gate 137. When both input signals are at a high value, the data from datain passes through the db input to the output of latch 153 and is latched when the pstrobe signal transitions to a low value. The aforementioned procedure is repeated for each of the latches 154–58 and NAND gates 138 and 141–44. Accordingly, one bit of data is latched for each transition of the pstrobe and nstrobe signals from high values to low values. Data supplied by the datain path can be cyclically latched by latches 151–58 in relation to the nstrobe and pstrobe clocking signals and the wptrp and wptrn write pointer signals.

Referring again to the receive circuit of FIG. 7, the four bits of data are latched in latches 151–54 based on the pstrobe and nstrobe clocking signals. Accordingly, the four bits of data are latched in two cycles of the main clocking signal (which in this example has a frequency of 100 MHZ). In the example of FIG. 7, the data output from latches 151–54 are supplied to a first input of multiplexers 160*a–d*. The output from latches 155–58 are supplied to a second input of multiplexers 160*a–d*. The select input for multiplexers 160*a–d* is supplied as a read pointer signal "rptr." In this example, the rptr signal is supplied by the receiving component and may have a frequency that is in phase with the system clock signal with a frequency of 100 MHZ. In this example, the rptr signal has a frequency of approximately 50 MHZ. Accordingly, during the first half of each cycle of the system clock, data from the first inputs of multiplexers 160*a–d* are supplied as four bits of data to signal lines "data0," "data1," "data2," and "data3." During the second half of each cycle of the system clock, data from the second inputs of multiplexers 160*a–d* are supplied to the same signal lines.

Figure 8:
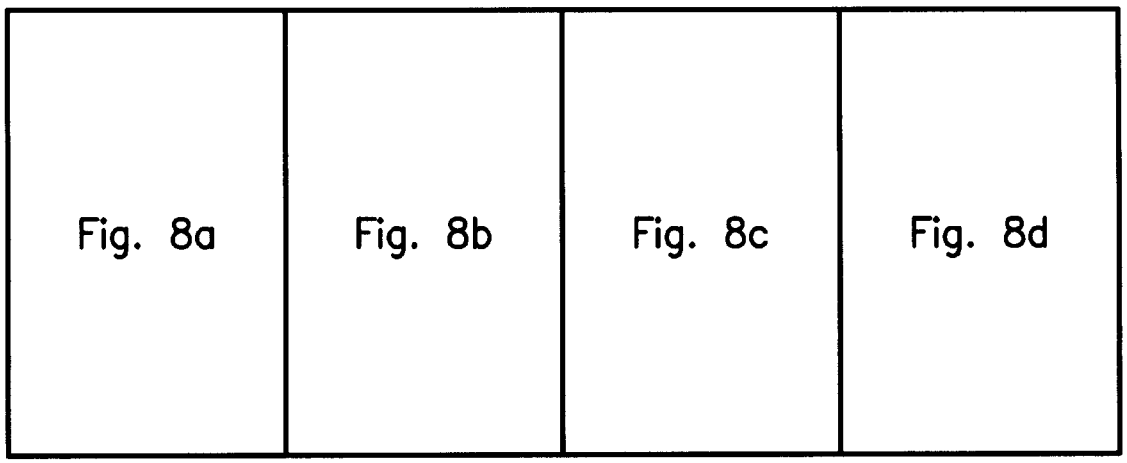
FIG. 8 is a timing diagram showing the relationship between various signals used in the apparatus of FIG. 4.

Referring to FIG. 8, a timing diagram for the transfer of eight bits of data from a first component to a second component over a data signal line is shown. The "clk" signal refers to a system clock signal that is supplied to both the first and second components. In this example, the frequency of the system clock is 100 MHZ and has a period of 10 ns. In this embodiment, when the system clock transitions from a high value to a low value at t=10 ns, the first component drives a first data signal (e.g., one bit of data) onto a data signal line ("data1"). At approximately the first quarter of the system clock cycle, the first component transitions the pstrobe signal to a low state indicating that valid data appears on the data signal line (see "pstrobe1"). The data signal and the pstrobe signal are received at the second component at some delay time later, and are indicated in FIG. 8 as the "pstrobe2" and "data2" signals.

Referring back to FIG. 7, the first data signal is received at the input of latches 151–58, and in particular latch 151. Subsequently, the pstrobe and wptrp0 signals will both have high values and the input data signal will appear at the output of the latch 151.

As shown in FIG. 8, the write pointer count for the pstrobe signal ("wptrp") is set to 0 (i.e., the two-bit counter 172 in FIG. 6*a* outputs a 0 value). After the transitioning of the pstrobe signal ("pstrobe2") from a high value to a low value, the first data signal can be latched. In this embodiment, the first data signal appears as win0data (see FIG. 7) a time delay later (e.g., $t_{Input}$ after the pstrobe transition and $t_{Sel}$ after the rptr transition) as long as the read pointer signal has a low value ("rptr"). At t=15 ns, the first component drives a second bit of data onto the data signal line. At three quarters of the system clock cycle, the first component then transitions the pstrobe signal to a high value and transitions the nstrobe signal to a low value. As described above with respect to FIG. 6*a*, the transition of the nstrobe signal from a high value to a low value is delayed by latch 122*c*.

Referring back to FIG. 7, the second data signal is received at the input of latches 151–58 and in particular latch 152. Subsequently, the nstrobe and wptrn0 signals will both have high values and the input data signal will appear at the output of the latch 152.

As shown in FIG. 8, the write pointer count for the nstrobe signal ("wptrn") is set to 0 (i.e., the two bit counter 81 in FIG. 6*b* outputs a 0 value). After the transitioning of the nstrobe signal from a high value to a low value, the second data signal can be latched. In this embodiment, the second data signal appears at win1data (see FIG. 7) a time delay later (e.g., $t_{Input}$ after the pstrobe transition and $t_{Sel}$ after the rptr transition) as long as the read pointer signal has a low value ("rptr"). The third and fourth data signals are transferred from the first component to the second component in a like manner with the wptrp and wptrn values changing to 1. The fifth through eighth data signals are also transferred in a similar manner, except that the read pointer signal is set to a high value (e.g., these data signals appear at the output of multiplexers 160*a–d* a delay of $t_{Sel}$ after the rptr transition). According to an embodiment of the present invention, the receive circuit of FIG. 7 resides in each of the first I/O pad buffer cells (e.g., cells 31–33). The pstrobe and nstrobe clocking signals may be provided by two second I/O pad buffer cells (e.g., cell 35). In all, with the example of FIGS. 4–8, eight bits of data can be transferred between first and second components in 4 cycles of the system clock.

A method and apparatus has been described above where data and clocking signals are sent between first and second components and the data signals are latched based on the clocking signals. This manner for transmitting data between components can be extended to three or more components coupled to a common bus. As seen in FIG. 4, a third component 119 may be coupled to clocking signal lines 114 and data signal lines 113 (e.g., that form part of a bus). Preferably, the data signal lines and clocking signal line(s) match (e.g., have the same length) so as to reduce clock skew between signals.

Figure 9:
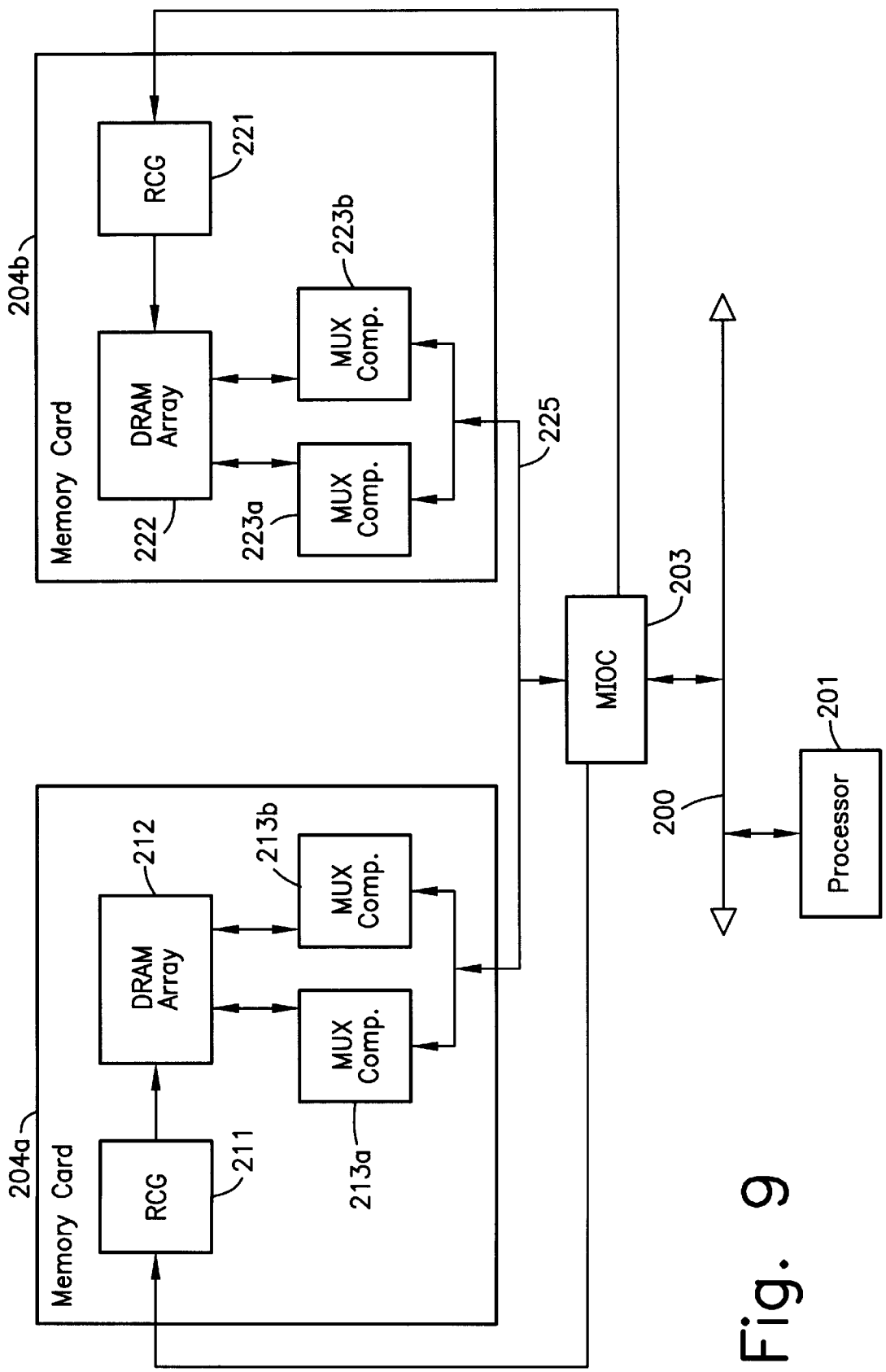
FIG. 9 is a block diagram of a system including a memory input/output controller and memory cards incorporating an embodiment of the present invention.
Figure 10A:
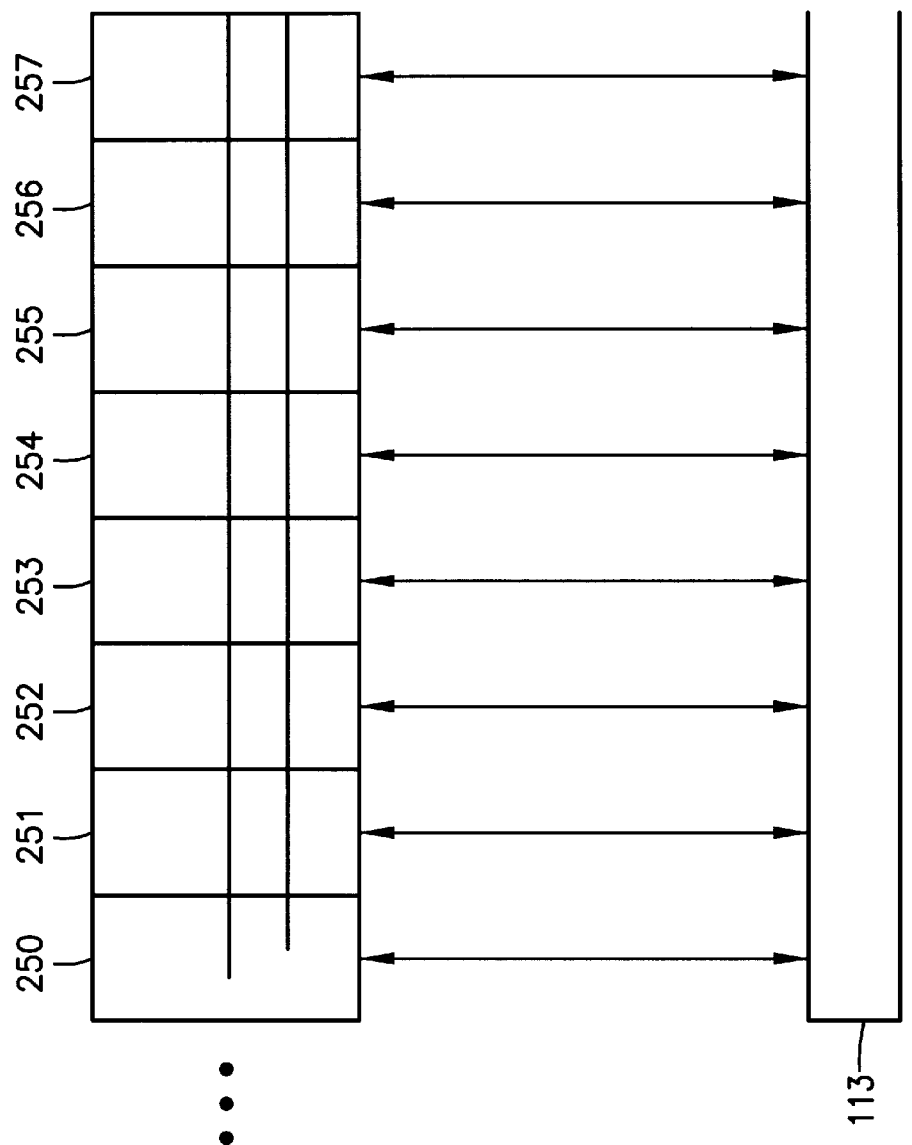
Figure 10B:
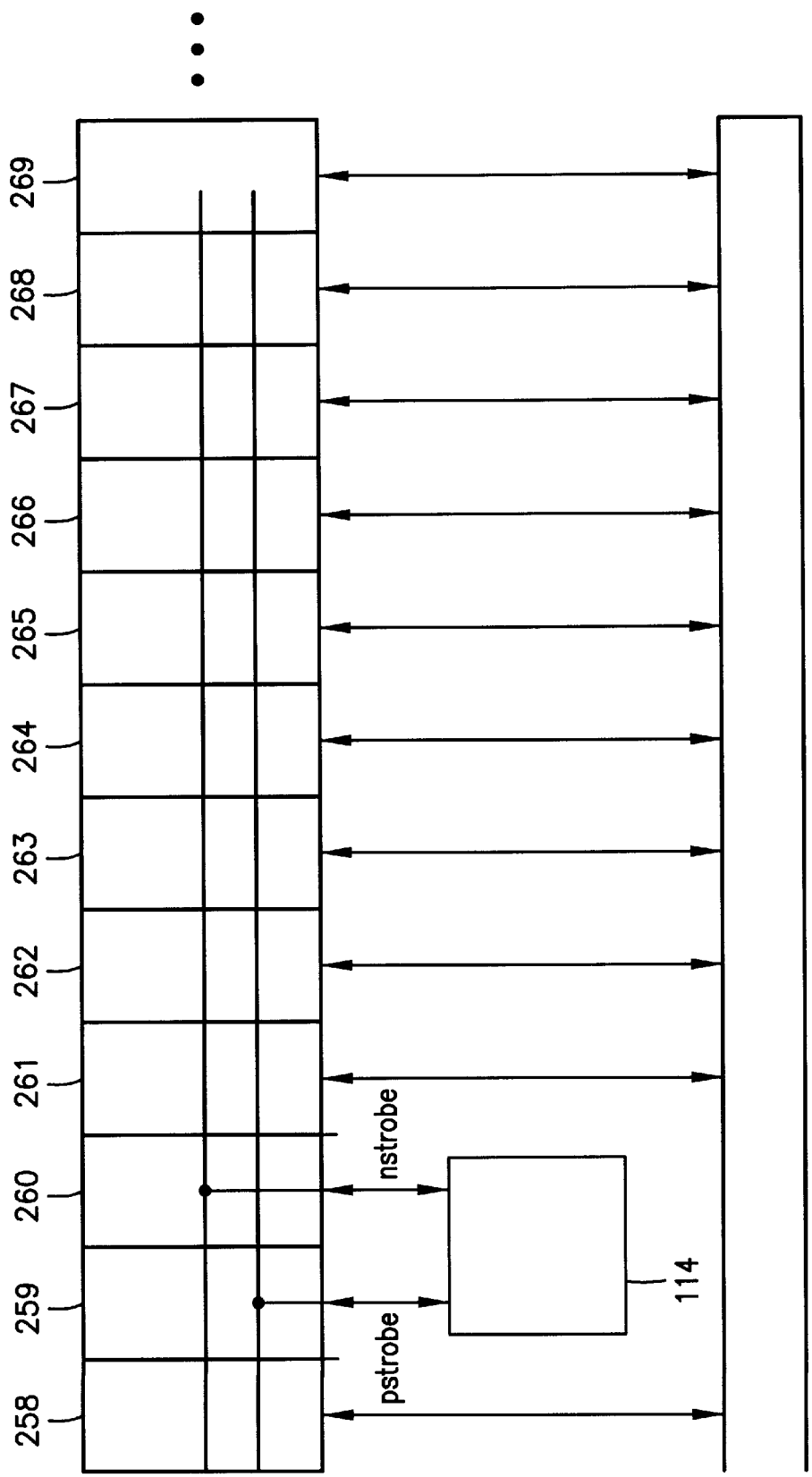

An example of a system using the present invention with three components is shown in FIG. 9. In this example, a processor 201, such as a Pentium® II processor manufactured by Intel Corporation, Santa Clara, Calif., is coupled to a host bus 200. A memory input/output controller (MIOC) 203 is coupled to host bus 200 and provides an interface between host bus 200 and memory cards 204a and 204b. MIOC 203 generates memory address and control signals that are transferred to a so-called "Ras Cas" generator (RCG) 211, 221 in memory cards 204a, 204b, respectively. RCGs 211, 221 generate Ras Cas addresses for dynamic random access memory (DRAM) arrays 212, 222. During read operations, data is transmitted from DRAM arrays 212, 222 to multiplexer (MUX) components 213a–b and 223a–b, respectively. In this example, MUX components 213a–b and 223a–b each receive/send 244 bits from/to DRAM arrays 212, 222, respectively, and transmit/receive data 72 bits at a time to/from MIOC 203 over memory data bus 225. In this example, memory data bus 225 includes 72 data signal lines and 8 clocking signal lines.

Using the embodiment of the present invention described with respect to FIGS. 4–8, each MUX component 213a–b and 223a–b and MIOC 203 is adapted to drive data signals onto the data signal lines with the pstrobe and nstrobe signals. In this example, 72 data bits are sent between the MIOC 203 and the MUX components 213a–b and 223a–b on each transition from a high value to a low value for the pstrobe and nstrobe signals. Accordingly, 288 (4×72) data bits (i.e., an entire cache line in many architectures) can be transferred in two system clock cycles.

Figure 10:
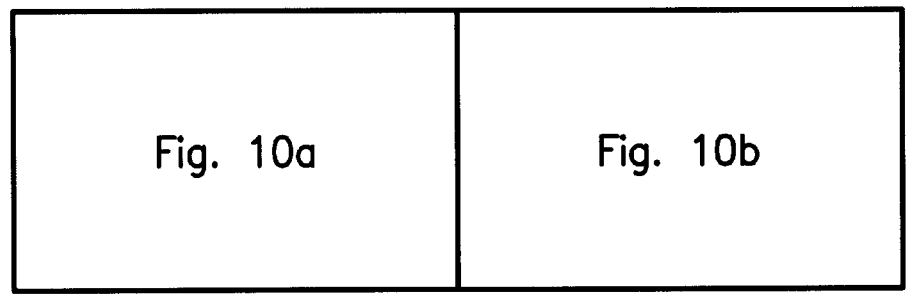
FIG. 10 is a block diagram of an array of input/output pad buffer cells for use in components of the system of FIG. 9.
Figure 8B:
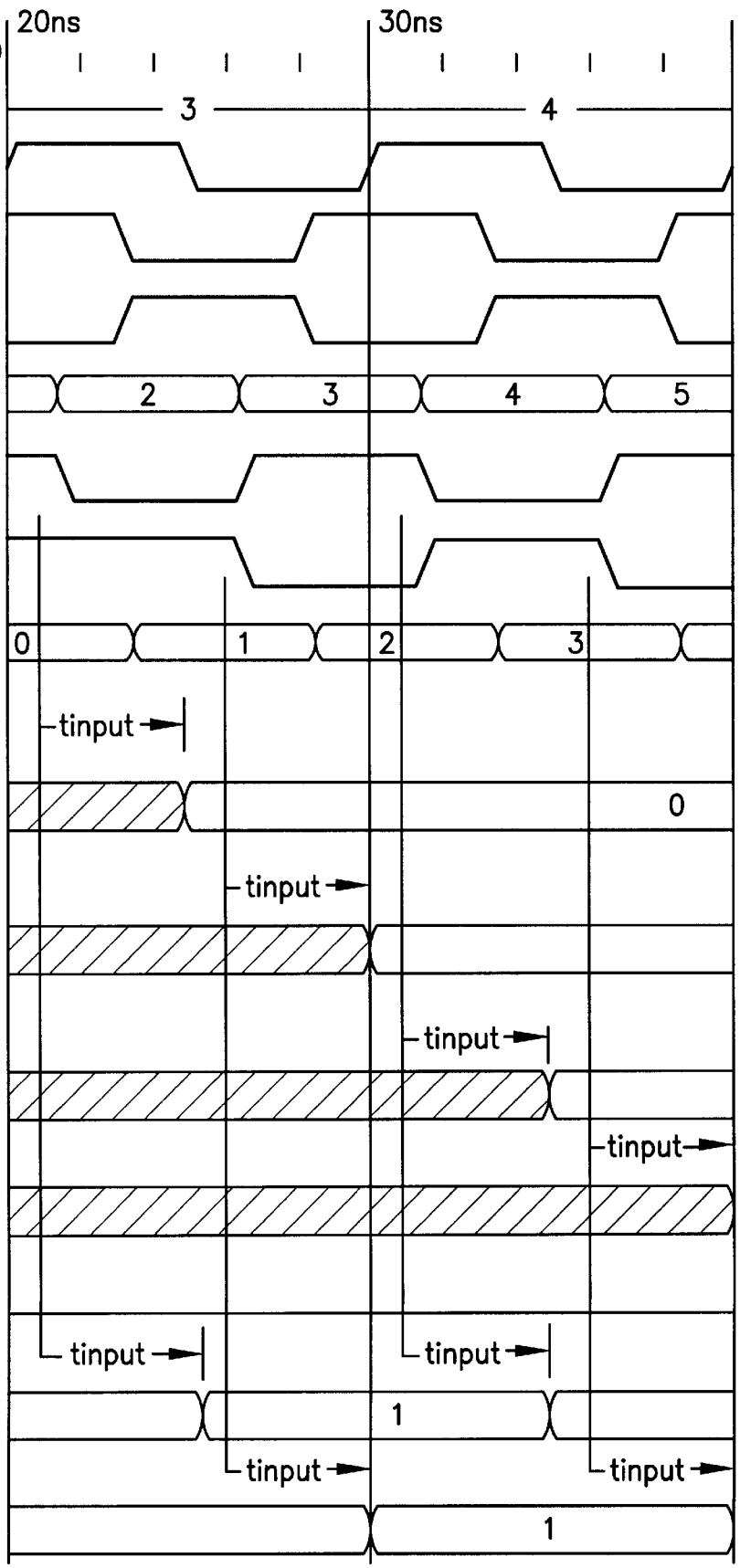
Figure 8B:
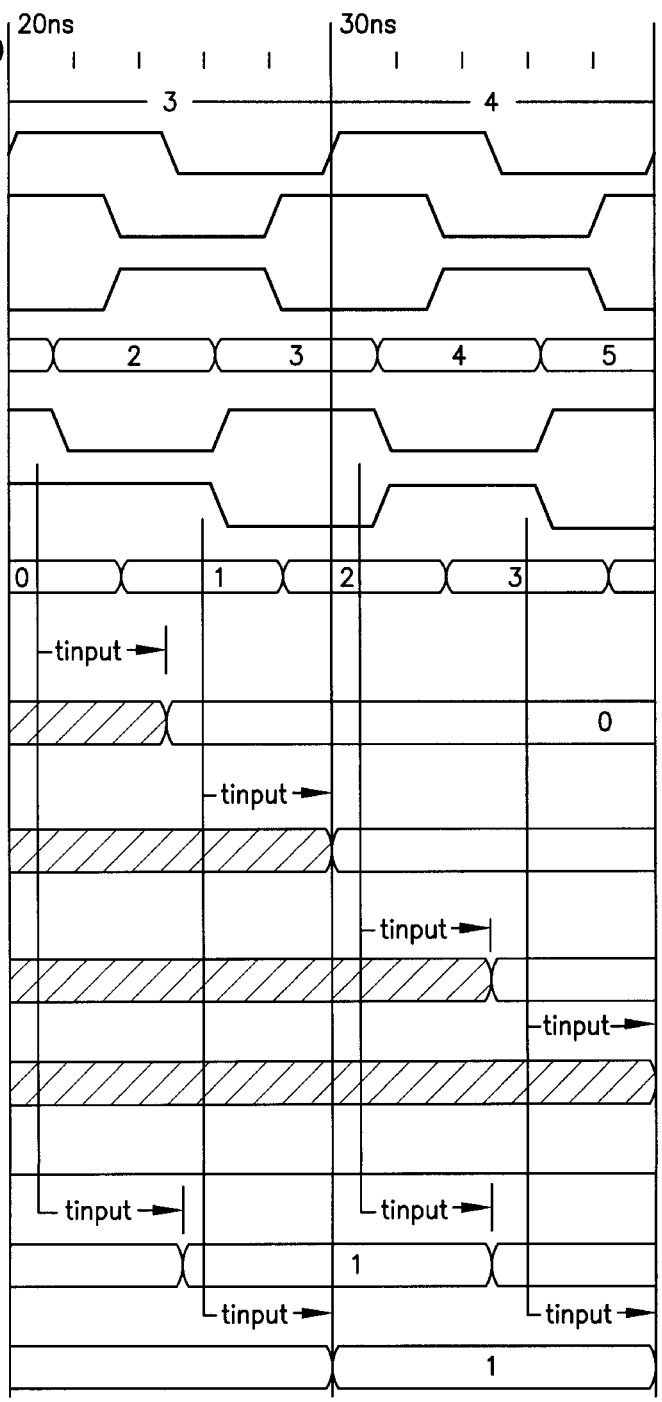
Figure 8C:
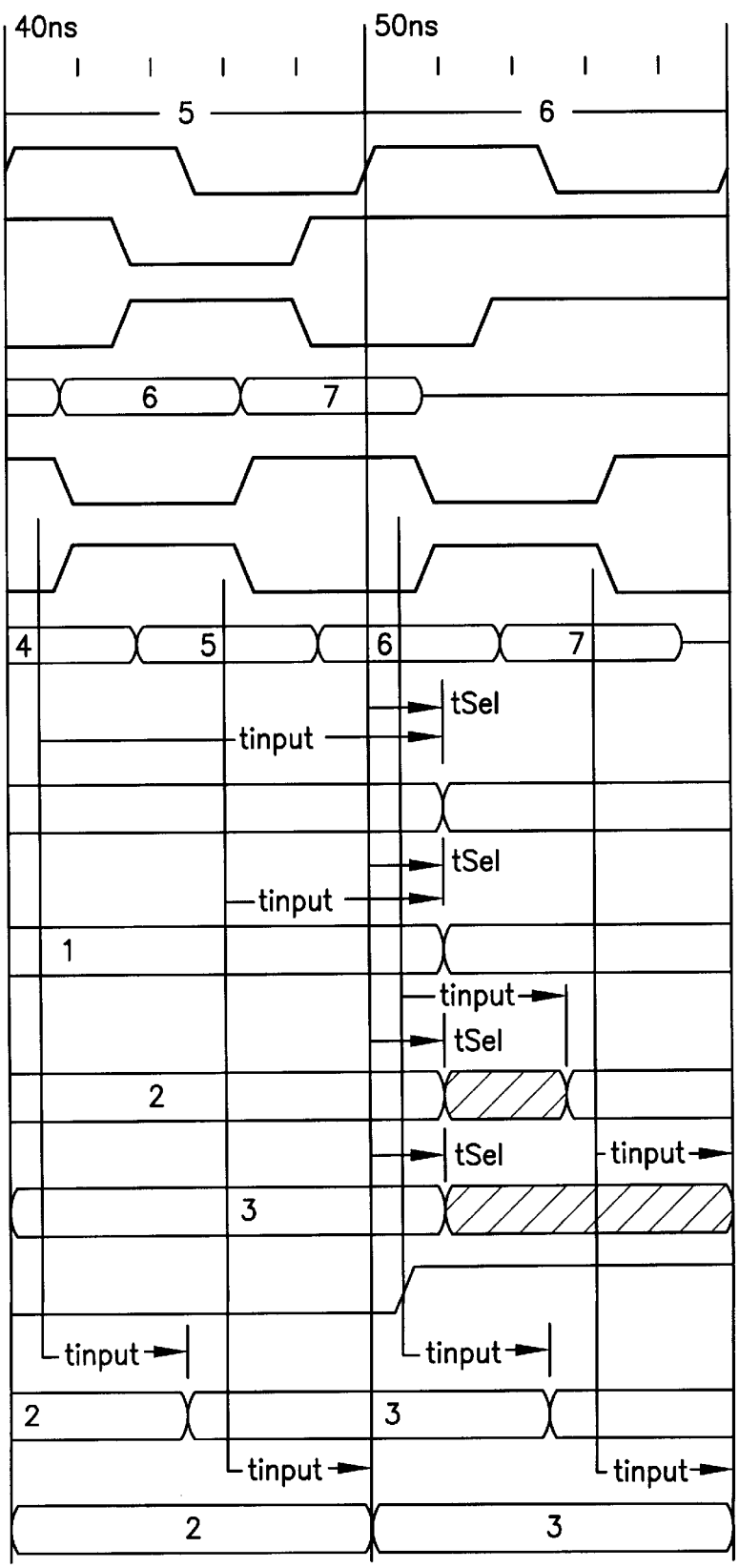
Figure 8D:
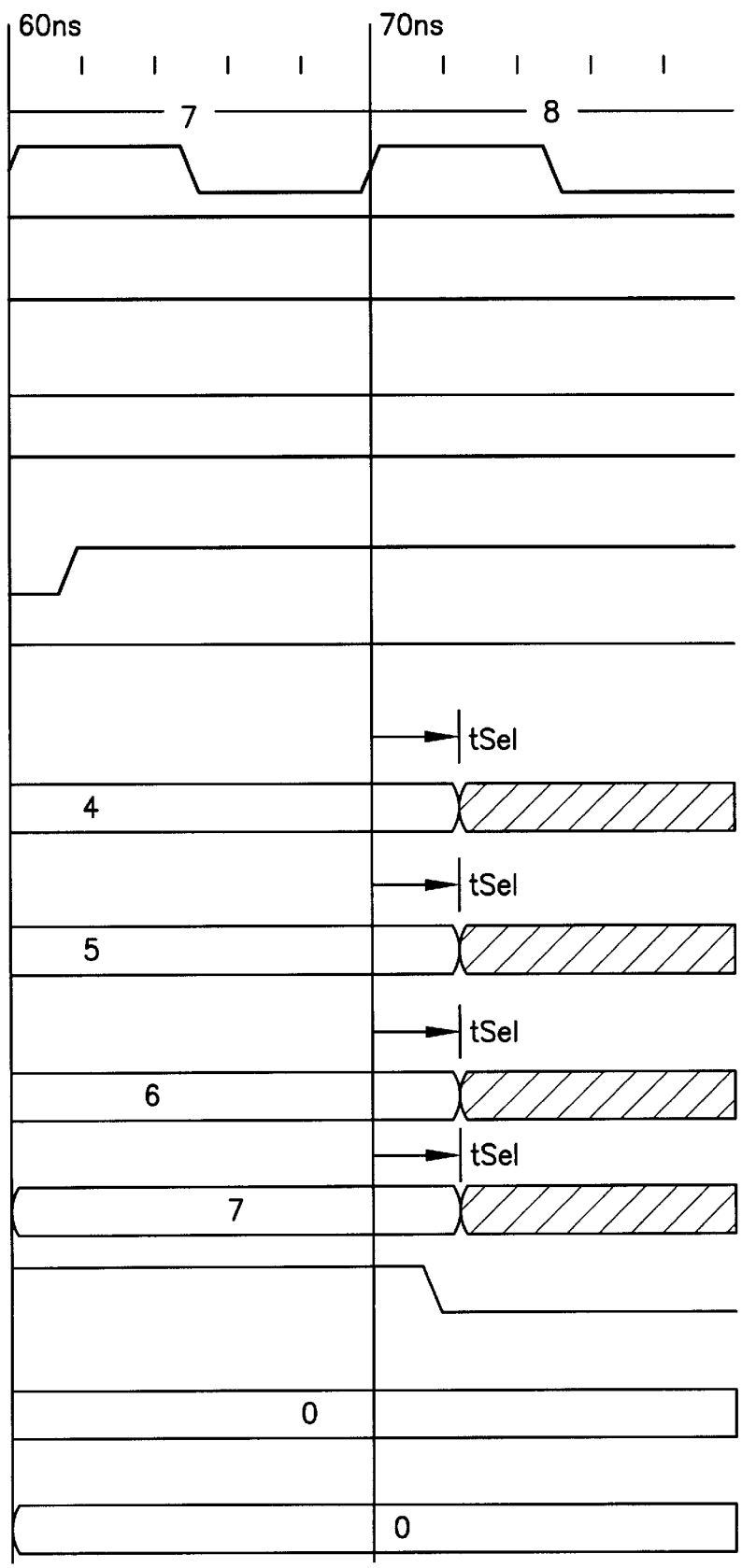

Referring to FIG. 10, and example of an arrangement of I/O pad buffer cells 250–69 is shown. In this example, cells 250–58 and 261–69 are coupled to data signal lines 113. Cell 259 is coupled to a pstrobe signal line and Cell 260 is coupled to a nstrobe signal line from clocking signal lines 114. In this example, each of cells 250–258 and 261–269 includes the receive and transmit circuit shown in FIGS. 5 and 7 and has a similar construction so that the same circuits can be repeated during the manufacturing process. Also, cell 259 includes the clocking circuit of FIG. 6b and cell 260 includes the clocking circuit of FIG. 6a. The pstrobe signal received at cell 259 is supplied to latches in cells 250–58 and 261–69 in a manner similar to that shown in FIG. 3 (e.g., via conductive trace pins). Likewise, the nstrobe signal received at cell 260 is supplied to latches in cells 250–258 and 261–69 in a similar manner. With the 20 cells of FIG. 10, 18 bits of data can be transmitted or received. Accordingly, in the example of FIG. 9, four such arrangements of cells are provided in each MUX component 213a–b and 223a–b and MIOC 203 (i.e., 4×18=72 data bits per component).

Although embodiments are specifically illustrated and described herein, it will be appreciated that modifications and variations of the present invention are covered by the above teachings and within the purview of the appended claims without departing from the spirit and intended scope of the invention.

What is claimed is:

1. An electronic circuit die comprising:
   a plurality of first input/output pad buffer cells, each including:
      a pad adapted to be coupled to a bond wire; and
      a latch coupled to said pad and adapted to receive data signals from said pad.

2. The electronic circuit die of claim 1 wherein each of said plurality of first input/output pad buffer cells are of similar construction.

3. The electronic circuit die of claim 2 further comprising:
   a plurality of conductive trace pins, conductively coupling adjacent ones of said first input/output pad buffer cells.

4. An electronic circuit die comprising:
   a plurality of first input/output pad buffer cells, each including:
      a pad adapted to be coupled to a bond wire;
      a latch coupled to said pad and adapted to receive data signals from said pad; and
      a plurality of conductive trace pins, conductively coupling adjacent ones of said first input/output pad buffer cells;
   wherein each of said plurality of first input/output pad buffer cells are of similar construction; and
   a plurality of second input/output pad buffer cells, each including:
      a second pad adapted to be coupled to a bond wire and adapted to receive a clocking signal;
   wherein latches of ones of said first input/output pad buffer cells are conductively coupled to at least one of said second input/output pad buffer cells via ones of said conductive trace pins and adapted to receive said clocking signal.

5. The electronic circuit die of claim 4 wherein the pads of said first input/output pad buffer cells are coupled to data signal lines of a bus and pads of said second input/output pad buffer cells are coupled to clocking signal lines of said bus.

6. An apparatus for transferring data signals between two components comprising:
   first and second components, each including
      a plurality of first input/output pad buffer cells, each cell including a pad adapted to be coupled to a bond wire; and a latch coupled to said pad and adapted to receive data signals from said pad;
      a plurality of conductive trace pins, conductively coupling adjacent ones of said first input/output pad buffer cells; and
      a plurality of second input/output pad buffer cells, each including a pad adapted to be coupled to a bond wire and adapted to receive a clocking signal, wherein latches of ones of said first input/output pad buffer cells are conductively coupled to at least one of said second input/output pad buffer cells via ones of said conductive traces pins and adapted to receive said clocking signal;
   a plurality of data signal lines coupled between ones of said first input/output pad buffer cells of said first and second components;
   at least one bidirectional clocking signal line coupled between a second input/output pad buffer cell of each of said first and second components;
   each of said first and second components is adapted to transmit data signals over said data signal line and at least one clocking signal over said clocking signal line to another of said first and second components, and each of said first and second components is adapted to receive and latch data signals in relation to a clocking signal received from the other of said first and second components.

7. The apparatus of claim 6 wherein each of said plurality of first input/output pad buffer cells are of similar construction.

8. The apparatus of claim 7 wherein said data signals are latched in latches of said first input/output pad buffer cells when said clocking signal transitions from a high value to a low value.

9. The apparatus of claim 7 wherein said first component is part of a memory card and said second component is part of a memory input/output controller.

10. An apparatus for transferring data signals among at least three components comprising:

first, second, and third components, each including
   a plurality of first input/output pad buffer cells, each cell including a pad adapted to be coupled to a bond wire; and a latch coupled to said pad and adapted to receive data signals from said pad;
   a plurality of conductive trace pins, conductively coupling adjacent ones of said first input/output pad buffer cells; and
   a plurality of second input/output pad buffer cells, each including a pad adapted to be coupled to a bond wire and adapted to receive a clocking signal, wherein latches of ones of said first input/output pad buffer cells are conductively coupled to at least one of said second input/output pad buffer cells via ones of said conductive traces pins and adapted to receive said clocking signal;

a plurality of data signal lines of a bus coupled between ones of said first input/output pad buffer cells of said first, second, and third components;

at least one bidirectional clocking signal line of said bus coupled between a second input/output pad buffer cell of each of said first, second, and third components;

each of said first, second, and third components is adapted to transmit data signals over said data signal lines and at least one clocking signal over said clocking signal line to another of said first, second, and third components, and each of said first, second, and third components is adapted to receive and latch data signals in said first input/output pad buffer cells in relation to a clocking signal received from the other of said first, second, and third components.

11. The apparatus of claim 10 wherein each of said plurality of first input/output pad buffer cells are of similar construction.

12. The apparatus of claim 11 wherein said data signals are latched in said first input/output pad buffer cells when said clocking signal transitions from a high value to a low value.

13. The apparatus of claim 11 wherein said first and second components are part of respective first and second memory cards and said third component is part of a memory input/output controller.

14. A method of transferring a data signal relative to an electronic circuit die comprising:

receiving a data signal at a pad of a pad buffer cell in said electronic circuit die; and latching said data signal in a latch in said pad buffer cell.

15. The method of claim 14 further comprising:

receiving a clocking signal at a second pad of a second pad buffer cell in said electronic circuit die; and supplying said clocking signal to said latch.

16. The method of claim 15 further comprising:

receiving a second data signal in said pad buffer cell from core logic in said electronic circuit die; and transmitting said second data signal to said pad of said pad buffer cell.

* * * * *

UNITED STATES PATENT AND TRADEMARK OFFICE
CERTIFICATE OF CORRECTION

PATENT NO. : 6,151,257
DATED : November 21, 2000
INVENTOR(S) : Jeffrey E. Smith; Timothy W. Kelly; Stephen W. Kiss; Keith M. Self It is certified that error appears in the above-identified patent and that said Letters Patent is hereby corrected as shown below:

<u>Title page,</u>
Item [75], "Smith E. Jeffrey" should be -- Jeffrey E. Smith --.

Signed and Sealed this

Second Day of October, 2001

Attest:

NICHOLAS P. GODICI
Attesting Officer
Acting Director of the United States Patent and Trademark Office